United States Patent
Eun et al.

(10) Patent No.: US 7,399,356 B2
(45) Date of Patent: Jul. 15, 2008

(54) METHOD FOR PREPARATION OF FERROELECTRIC SINGLE CRYSTAL FILM STRUCTURE USING DEPOSITION METHOD

(75) Inventors: Jaehwan Eun, Jeonju-si (KR); Sang-Goo Lee, Siheung-si (KR); Hyeongjoon Kim, Seongnam-si (KR); Minchan Kim, Jeju-si (KR)

(73) Assignee: Ibule Photonics, Inc. (KR)

( * ) Notice: Subject to any disclaimer, the term of this patent is extended or adjusted under 35 U.S.C. 154(b) by 291 days.

(21) Appl. No.: 10/539,883

(22) PCT Filed: Jul. 14, 2003

(86) PCT No.: PCT/KR03/01391

§ 371 (c)(1),
(2), (4) Date: Jun. 17, 2005

(87) PCT Pub. No.: WO2004/055876

PCT Pub. Date: Jul. 1, 2004

(65) Prior Publication Data

US 2006/0042541 A1    Mar. 2, 2006

(30) Foreign Application Priority Data

Dec. 17, 2002  (KR) .................. 10-2002-0080745
Feb. 28, 2003  (KR) .................. 10-2003-0012846

(51) Int. Cl.
*C30B 21/02*   (2006.01)

(52) U.S. Cl. .............................. 117/86; 117/90; 117/95; 117/96; 117/932

(58) Field of Classification Search ................. 117/90, 117/95, 96, 86, 932
See application file for complete search history.

(56) References Cited

U.S. PATENT DOCUMENTS

| | | | | |
|---|---|---|---|---|
| 5,777,356 A * | 7/1998 | Dhote et al. | ................. | 257/295 |
| 5,912,486 A * | 6/1999 | Summerfelt | ................. | 257/310 |
| 6,610,549 B1 * | 8/2003 | Aggarwal et al. | ............... | 438/3 |
| 2004/0238861 A1 * | 12/2004 | Hwang et al. | ............... | 257/295 |

FOREIGN PATENT DOCUMENTS

| | | |
|---|---|---|
| CN | 1362749 A | 8/2002 |
| CN | 1379460 A | 11/2002 |
| JP | 2000-068455 A | 3/2000 |

* cited by examiner

*Primary Examiner*—Robert M Kunemund
(74) *Attorney, Agent, or Firm*—Baker Hostetler, LLP

(57) ABSTRACT

A film structure of a ferroelectric single crystal which can be beneficially used in the fabrication of high-performance electric and electronic parts and devices is prepared by forming an electrode layer having a perovskite crystal structure on a substrate made of a silicon or ferroelectric single crystal optionally polished to have a off-axis crystal structure, and epitaxially growing a layer of a ferroelectric single crystal thereon by pulsed laser deposition (PLD) or metallorganic chemical vapor deposition (MOCVD).

10 Claims, 4 Drawing Sheets

METHOD FOR PREPARATION OF FERROELECTRIC SINGLE CRYSTAL FILM STRUCTURE USING DEPOSITION METHOD

FIELD OF THE INVENTION

The present invention relates to a method for preparing a film structure comprising a ferroelectric single crystal, useful for the fabrication of many electric and electronic devices, particularly by way of employing a pulsed laser deposition (PLD) or metallorganic chemical vapor deposition (MOCVD).

BACKGROUND OF THE INVENTION

A ferroelectric thin film or thick film is frequently used in various electric and electronic parts, and it has been hitherto prepared by coating a PZT film on a substrate by a screen-printing or sol-gel method, calcining the coated substrate to crystallize the material, or by depositing the single crystal-forming raw material under a vacuum (see N. Setter, Piezoelectric Materials in Devices, Ceramics Laboratory, EPFL 2002).

Although the prior methods are simple and convenient, the film thus prepared still exhibits unsatisfactory performance characteristics in terms of current loss, electromechanical coupling coefficient and dielectric constant. Further, the calcination step of the prior methods requires the use of a high-cost, high-melting metal such as Pt and Au as an electrode material.

Therefore, there has existed a need to develop a simple method of providing a ferroelectric film, especially in the form of a single crystal layer, of improved properties suitable for electric and electronic devices and parts.

SUMMARY OF THE INVENTION

It is, therefore, a primary object of the invention to provide a novel method for preparing a ferroelectric film structure using a ferroelectric single crystal having a high dielectric constant together with good electromechanical and electrooptical properties.

In accordance with an aspect of the present invention, there is provided a method for preparing a film structure of a ferroelectric single crystal, which comprises forming a layer of an electrode material having a perovskite crystal structure on a substrate, and growing a layer of a ferroelectric single crystal on the electrode material layer by a pulsed laser deposition (PLD) or metallorganic chemical vapor deposition (MOCVD) method.

BRIEF DESCRIPTION OF THE DRAWINGS

The above and other objects and features of the present invention will become apparent from the following description thereof, when taken in conjunction with the accompanying drawings which respectively show.

DETAILED DESCRIPTION OF THE INVENTION

Figure 1:
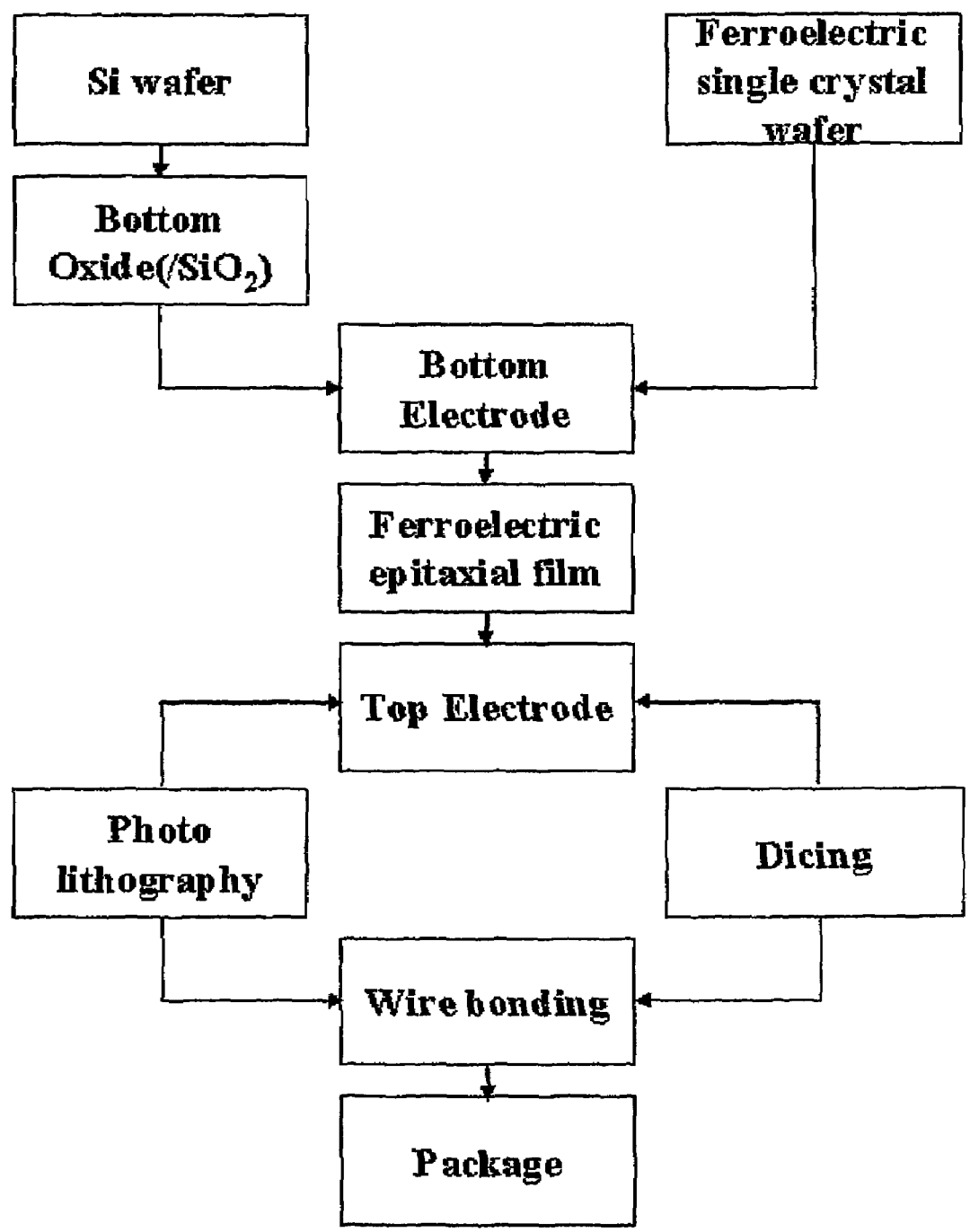
FIG. 1: a schematic block diagram of the process for preparing a single crystal film structure according to the present invention.

The inventive method for preparing a ferroelectric film structure is characterized by epitaxially growing a ferroelectric single crystal layer on an electrode material layer having a perovskite crystal structure via a PLD or MOCVD method. Preferably, in the inventive method, a silicon or ferroelectric single crystal plate optionally polished to have off-axis crystal structure may be used as a substrate, and in the case of using silicon substrate, a metal oxide layer having a perovskite crystal structure may be further introduced before the formation of the electrode layer as an intermediate layer between the substrate and the electrode layer.

In the present invention, a ferroelectric single crystal material having a dielectric constant of 1,000 or higher as measured in the form of a film may be preferably employed.

Representative examples of the ferroelectric single crystal used in the present invention include PMN-PT (lead magnesium niobate-lead titanate), PZN-PT (lead zinc niobate-lead titanate), LN (lithium niobate, $LiNbO_3$), LT (Lithium tantalate, $LiTaO_3$), langasite ($La_3Ga_5SiO_{14}$) and other piezoelectric and electrooptical materials known in the art.

The PMN-PT- and PZN-PT-based materials preferably have the composition of formula (I):

$$x(A)y(B)z(C)\text{-}p(P)n(N) \qquad (I)$$

wherein,
(A) is $Pb(Mg_{1/3}Nb_{2/3})O_3$ or $Pb(Zn_{1/3}Nb_{2/3})O_3$,
(B) is $PbTiO_3$,
(C) is $LiTaO_3$,
(P) is a metal selected from the group consisting of Pt, Au, Ag, Pd and Rh,
(N) is an oxide of a metal selected from the group consisting of Ni, Co, Fe, Sr, Sc, Ru, Cu and Cd,
x is a number in the range of 0.65 to 0.98,
y is a number in the range of 0.01 to 0.34,
z is a number in the range of 0.01 to 0.1, and
p and n are each independently a number in the range of 0.01 to 5.

The material of formula (I) is a homogeneous single crystal and it may be prepared by a solid phase reaction followed by melting-crystallization, as disclosed in Korean Patent Laid-open Publication No. 2001-96505. Specifically, the materials of formula (I) may be prepared by (a) mixing a component selected from $Pb(Mg_{1/3}Nb_{2/3})O_3$ and $Pb(Zn_{1/3}Nb_{2/3})O_3$ with $PbTiO_3$, and $LiTaO_3$, in relative molar amounts ranging from 0.65 to 0.98, 0.01 to 0.34 and 0.01 to 0.1, respectively, (b) adding to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, (c) calcining the mixture obtained in (b), followed by pulverizing the calcination product, (d) melting the powder obtained in (c), and (e) cooling the melt to crystallize. The single crystal prepared by the above procedure preferably has a diameter of 5 cm or greater.

The LN single crystal can be prepared from $Li_2CO_3$ and $Nb_2O_5$, the LT single crystal, from $Li_2CO_3$ and $Ta_2O_5$, and the langasite single crystal, from $La_2O_3$, $Ga_2O_3$ and $SiO_2$, by Czochralslci's method (see Yuhuan Xu, Ferroelectric materials and their applications, pp 221-224, North-holland (1991)). These materials are commercially available.

In particular, the ferroelectric single crystal of formula (I) has an electromechanical coupling coefficient superior to that of the existing PZT single or poly crystal as well as a high driving voltage, a wide range of bending deformation, and good electrooptical property, and thus it can be processed minutely. The ferroelectric material of formula (I) has a dielectric constant of about 7,000 (in a film form, about 2,000), a loss piezoelectric constant of about 0.001 (in a film form, about 0.003), $d_{33}$ of about 2,500 and $k_{33}$ of about 0.97. The existing PZT film typically shows a dielectric constant of about 400 to 500 and a loss piezoelectric constant of about 0.006 to 0.02.

The method of preparing a single crystal film structure according to the present invention is described below with reference to the accompanying drawings.

As shown in FIG. 1, in accordance with the present invention, a single crystal film structure can be prepared by optionally forming an oxide layer having a perovskite crystal structure on a Si or ferroelectric single crystal substrate having an on-axis crystal structure or an off-axis crystal structure, forming a layer of a material having a perovskite crystal structure thereon as a bottom electrode layer, and epitaxially growing a ferroelectric single crystal layer on the electrode layer by a PLD or MODVD method. Subsequently, the single crystal film structure prepared by the inventive method may be used in the fabrication of an electronic or electric part in a conventional manner, e.g., by forming a top electrode layer on the single crystal layer, patterning the resulting laminate by etching via a photolithography or dicing, and wiring the patterned laminate.

FIG. 2a to 2e shows the procedure for preparing a ferroelectric single crystal film structure using a silicon single crystal substrate having an on-axis crystal structure, and FIG. 3a to 3e, using an off-axis ferroelectric single crystal substrate.

Figure 2A:
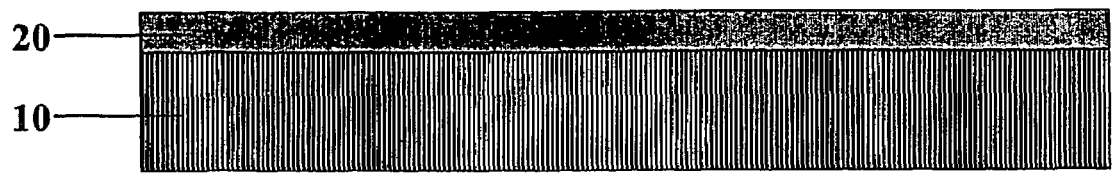
FIG. 2a to 2e: the procedure for preparing a ferroelectric single crystal film structure using a silicon single crystal substrate having an on-axis crystal structure.

FIG. 2a represents an optional step of forming an oxide layer (20) on a Si substrate (10) in a conventional manner. The oxide layer (20) may be preferably formed by a PLD or MOCVD method to a thickness of 10 μm or less. The oxide layer may be formed by ALD (Atomic Laser Deposition), MBE (Molecular Beam Epitaxy) and other methods. Preferably, the oxide layer (20) may be made of a material having the same perovskite crystal structure as a ferroelectric single crystal, e.g., strontium titanate (STO; $SrTiO_3$).

Although not shown in the figure, the Si substrate (10) may be previously oxidized by heat-treatment to form a $SiO_2$ thin film of 1 μm thick or less thereon, before the formation of the oxide layer (20).

Figure 2B:
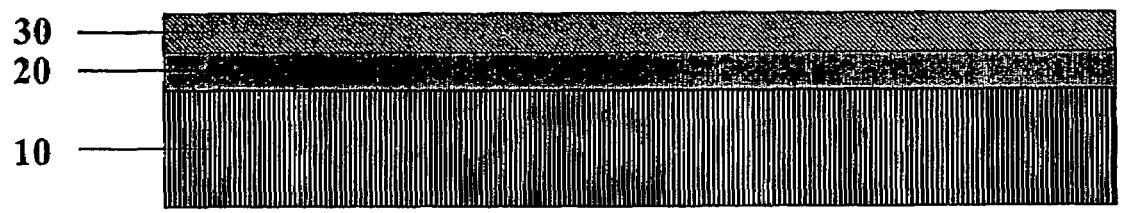

Subsequently, FIG. 2b shows the step of forming a bottom electrode layer (30) on the oxide layer (20), in the same manner as described in the formation of the oxide layer (20). The bottom electrode layer (30) may be formed to a thickness of 5 μm or less, and it may be made of a material having a perovskite crystal structure similarly to the oxide layer (20) and having a specific resistance of $9 \times 10^{-4}$ Ω cm or less. The bottom electrode layer (30) may be preferably made of strontium ruthenate (SRO; $SrRuO_3$) or lanthanum nickelate (LNO; $LaNiO_3$) having a specific resistance of about $1 \times 10^{-4}$ to $9 \times 10^{-4}$ Ω cm.

In accordance with the present invention, the formation of the bottom electrode layer and the optional oxide layer having the same perovskite crystal structure as that of the ferroelectric single crystal layer being deposited thereon can provide a seed for growing the ferroelectric single crystal.

Figure 2C:
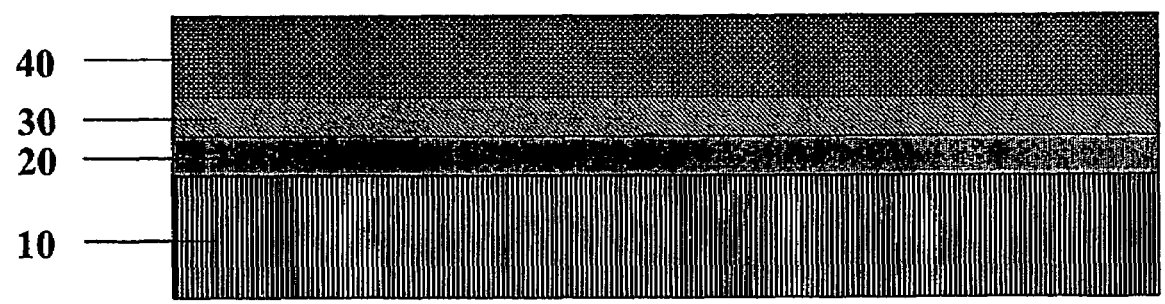

FIG. 2c depicts the step of epitaxially growing a ferroelectric single crystal layer (40) on the bottom electrode layer (30). The epitaxial growth of the ferroelectric single crystal layer (40) may be achieved by pulsed laser deposition PLD) in which a ferroelectric single crystal target is irradiated with a high-energy laser beam to be deposited on a substrate, or metallorganic chemical vapor deposition (MOCVD) in which an organic metal compound precursor is vaporized to be deposited on a substrate. The PLD or MOCVD may be carried our in a conventional manner as known in the art.

Representative precursors for the formation of the PMN-PT single crystal film include $Pb(THD)_2$, $Mg(THD)$, $Nb(THD)_4$, and $Ti(THD)_2$ (THD=tetramethyl heptanedionate). Similarly, an LN film may be deposited from Li(TED) and $Nb(TBD)_4$, and an LT film, Li(THD) and $Ta(THD)_4$.

The single crystal layer (40) may be suitably formed to a thickness ranging from 0.1 to 20 μm.

Figure 2D:
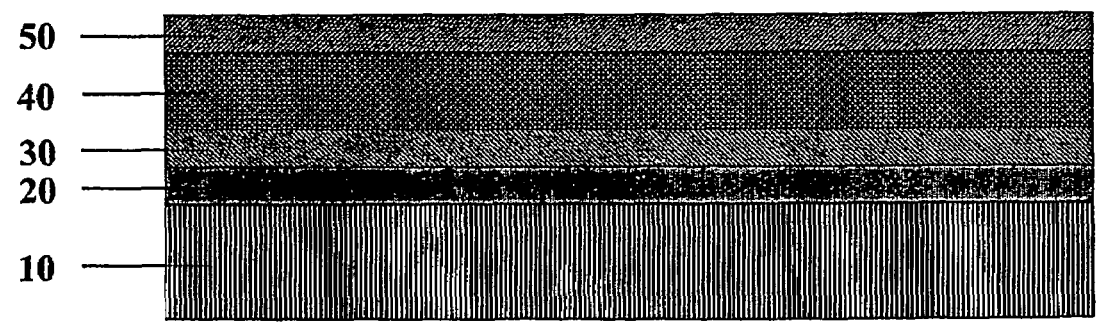

The single crystal film structure according to the present invention thus prepared may be further processed for the fabrication of various electric or electronic parts or devices. FIG. 2d represents the step of forming a top electrode (50) on the ferroelectric single crystal layer (40) by a conventional method, e.g., using a sputtering or electron beam evaporation method. In the prior art method in which a PZT paste is screen-printed and then calcined at 1,000° C. or higher to form a polycrystalline thin film, an expensive metal such as Pt, Au and Ag having a high melting temperature must be used as the top electrode. In the present invention, however, an inexpensive material including Al may be used. The thickness of the top electrode (50) may range from about 1 to 5 μm.

Figure 2E:
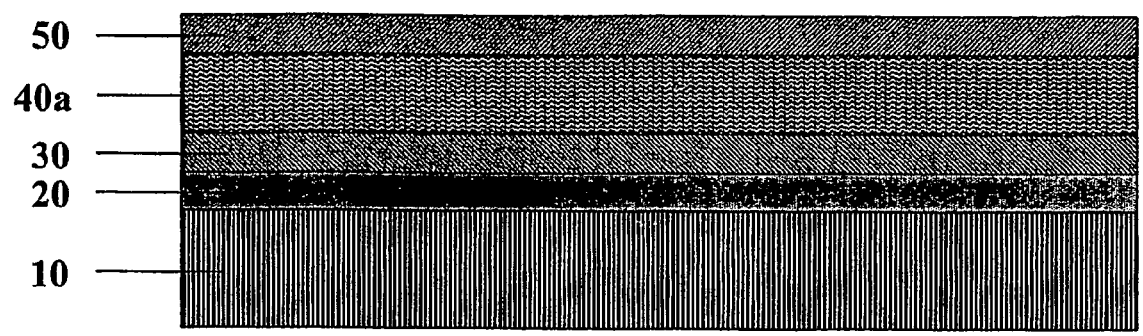

Subsequently, the step of polarizing the ferroelectric single crystal layer (40) disposed between the top and bottom electrodes (30 and 50) to obtain a polarized single crystal layer (40a) is shown in FIG. 2e. The polarizing process can be conducted by applying an electric field of 10 to 100 kV/cm to the single crystal layer (40) at 100 to 300° C. for 10 to 100 minutes.

Figure 3A:
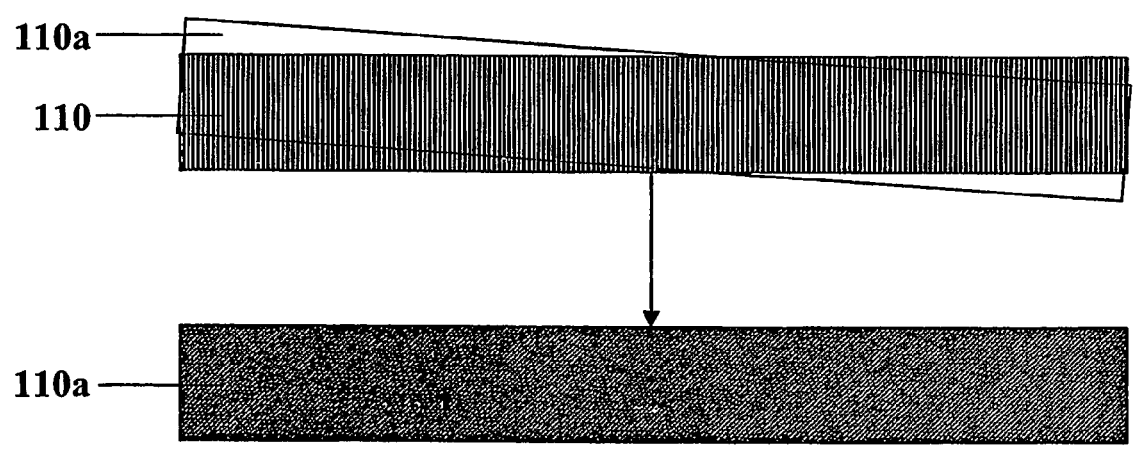
FIG. 3a to 3e: the procedure for preparing a ferroelectric single crystal film structure using a ferroelectric single crystal substrate having an off-axis crystal structure.

FIG. 3a shows the step of making an off-axis ferroelectric single crystal substrate (110a) having an off-axis angle of 0.1 to 10°, from a single crystal substrate (110) having a crystallinity oriented along the C (vertical) axis, by polishing. In general, the growth of a single crystal occurs more easily in the lateral direction than the perpendicular direction with respect to the crystal plane. Since the above polishing process generates stairs of seed portions for growing the single crystal, it may facilitate the epitaxial growth of the ferroelectric single crystal via deposition.

Figure 3B:
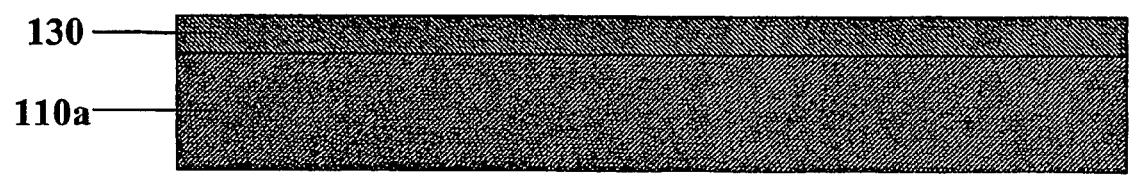
Figure 3C:
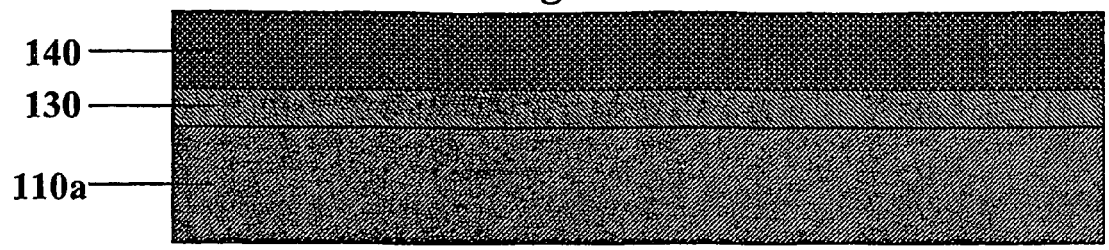
Figure 3D:
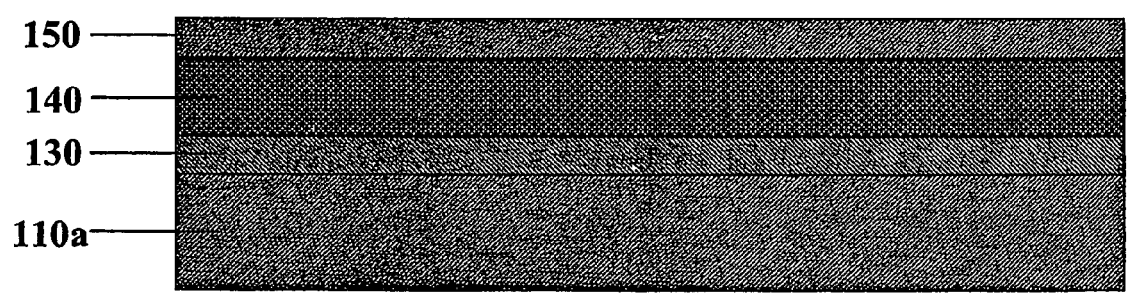
Figure 3E:
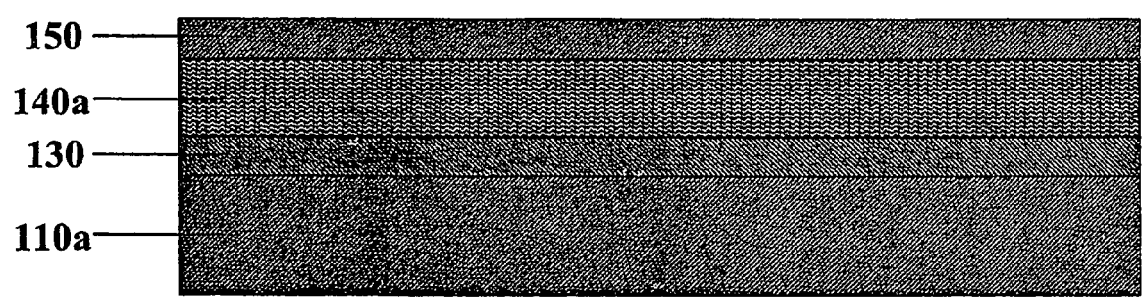

FIG. 3b shows the step of forming a bottom electrode layer (130) on the single crystal substrate (110a), and FIG. 3c depicts the step of forming a ferroelectric single crystal layer (140) on the bottom electrode layer (130). Further, FIG. 3d represents the step of forming a top electrode (150) and FIG. 3e shows the step of polarizing the ferroelectric single crystal layer (140). The above steps may be carried out in the same manner as described previously in FIG. 2b to FIG. 2e.

The laminates shown in FIG. 2e and FIG. 3e may be beneficially used in the fabrication of various electric or electronic parts and devices including a microactuator, an ultrasonic probe, a variable filter, and the like by etching or dicing the laminate via a photolithography to form a pattern thereon and wiring the patterned laminate.

While the invention has been described in connection with the above specific embodiments, it should be recognized that various modifications and changes may be made to the invention by those skilled in the art without departing from the scope of the invention as defined by the appended claims.

What is claimed is:

1. A method for preparing a film structure of a ferroelectric single crystal, which comprises the steps of:
    (a) forming a layer of a material having a perovskite crystal structure on a substrate as an electrode layer, the substrate being a ferroelectric single crystal substrate having an off-axed crystal structure or a silicon single crystal substrate having a metal oxide layer of perovskite crystal structure on the surface thereof, and (b) growing a layer of a ferroelectric single crystal on the electrode layer by a pulsed laser deposition (PLD) or metallorganic chemical vapor deposition (MOCVD) method, the ferroelectric single crystal being a material having the composition of formula (I):

$$x(A)y(B)z(C)\text{-}p(P)n(N) \qquad (I)$$

wherein,
(A) is $Pb(Mg_{1/3}Nb_{2/3})O3$ or $Pb(Zn_{1/3}Nb_{2/3})O_3$,
(B) is $PbTiO_3$,
(C) is $LiTaO_3$,
(P) is a metal selected from the group consisting of Pt, Au, Ag, Pd and Rh,
(N) is an oxide of a metal selected from the group consisting of Ni, Co, Fe, Sr, Sc, Ru, Cu and Cd,
x is a number in the range of 0.65 to 0.98,
y is a number in the range of 0.01 to 0.34,
z is a number in the range of 0.01 to 0.1, and
p and n are each independently a number in the range of 0.01 to 5.

2. The method of claim 1, wherein the grown ferroelectric single crystal layer has a thickness of 0.1 to 20 μm.

3. The method of claim 1, wherein the ferroelectric single crystal substrate having an off-axed crystal structure has an off-axis angle of 0.1 to 100 with respect to the C axis.

4. The method of claim 1, wherein the electrode layer having the perovskite crystal structure is made of strontium ruthenate ($SrRuO_3$) or lanthanium nickelate ($LaNiO_3$).

5. The method of claim 1, wherein the electrode layer has a specific resistance of $9\times10^{-4}$ Ωcm or less.

6. The method of claim 1, wherein the metal oxide layer having the perovskite crystal structure is made of strontium titanate ($SrTiO_3$).

7. The method of claim 1, wherein the electrode layer and/or metal oxide layer is formed by the method of PLD or MOCVD.

8. The method of claim 1, wherein the ferroelectric single crystal has a dielectric constant of 1,000 or greater as measured in a film form.

9. The method of claim 1, which further comprises forming a conductive metal layer on the surface of the ferroelectric single crystal layer opposite to the electrode layer having the perovskite crystalstructure, by a sputtering or an electronic beam evaporation method.

10. The method of claim 1, which further comprises oxidizing the substrate by heat-treatment to form a thin oxide film of 1 μm or less on the substrate.

* * * * *